(12) United States Patent
Wu et al.

(10) Patent No.: US 7,345,360 B2
(45) Date of Patent: Mar. 18, 2008

(54) MULTIPLE CHIPS IMAGE SENSOR PACKAGE

(75) Inventors: Jichen Wu, Hsinchu Hsien (TW); Figo Hsieh, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 827 days.

(21) Appl. No.: 10/705,379

(22) Filed: Nov. 10, 2003

(65) Prior Publication Data

US 2005/0099531 A1 May 12, 2005

(51) Int. Cl.
*H01L 23/06* (2006.01)

(52) U.S. Cl. .................. 257/684; 257/678; 257/685; 257/686; 257/723

(58) Field of Classification Search .............. 257/678, 257/684, 685, 686, 723
See application file for complete search history.

*Primary Examiner*—Long Pham
(74) *Attorney, Agent, or Firm*—Pro-Techtor Int'l Services

(57) ABSTRACT

A multi-chip image sensor module includes a first substrate; a photosensitive chip arranged on an upper surface of the first substrate; a lens holder mounted on the upper surface of the first substrate to encapsulate the photosensitive chip; a lens barrel arranged within the lens holder and formed with a chamber and an opening communicating with the chamber; an aspheric lens and a transparent layer placed within the chamber; a second substrate mounted on the first substrate and electrically connected to the first substrate; and a lower chip located on a second surface of the second substrate.

5 Claims, 2 Drawing Sheets

MULTIPLE CHIPS IMAGE SENSOR PACKAGE

BACKGROUND OF THE INVENTION

1. Field of the Invention

The invention relates to a multi-chip image sensor module, and in particular to an image sensor module having the improved quality and the reduced volume.

2. Description of the Related Art

Referring to FIG. 1, a conventional image sensor module includes a lens holder 10, a lens barrel 20, and an image sensor 30. The lens holder 10 has an upper end face 12, a lower end face 14 and an opening 16 penetrating through the lens holder 10 from the upper end face 12 to the lower end face 14. An internal thread 18 is formed on an inner wall of the opening 16 of the lens holder 10. The lens barrel 20 formed with an external thread 22 is inserted from the upper end face 12 of the lens holder 10, received within the opening 16, and screwed to the internal thread 18 of the lens holder 10. The lens barrel 20 is formed with a transparent region 24 under which an aspheric lens 26 and an infrared filter 28 are arranged in sequence. The image sensor 30 has a first surface 32 and a second surface 34 opposite to the first surface 32 on which a transparent layer 36 is arranged. The image sensor 30 is bonded to the lower end face 14 of the lens holder 10 through the transparent layer 36. The screwed length between the lens barrel 20 and the lens holder 10 may be adjusted to control the distance from the aspheric lens 26 of the lens barrel 20 to the transparent layer 36 of the image sensor 30.

The above-mentioned image sensor module has the following drawbacks.

1. Because the image sensor 30 is bonded to the lower end face 14 of the lens holder 10 through the transparent layer 36, the image sensor 30 cannot be replaced when the image sensor 30 of the module is damaged. In this case, the overall module has to be treated as a waste material, and other good elements in the module may not be recycled.

2. Because the transparent layer 36 is bonded to the lower end face 14 of the lens holder 10 by the adhesive, which may contaminate the surface of the transparent layer 36, poor optical signals may be obtained.

3. When the module is assembled, the transparent layer 36 has to be precisely positioned with the aspheric lens 26 and then bonded to the lens barrel 20. Once the positional precision deviates from the standard level, the overall module cannot be reassembled and has to be treated as the waste material 4. The lens holder 10 has to be additionally provided to combine the lens barrel 20 with the image sensor 30.

SUMMARY OF THE INVENTION

An object of the present invention is to provide a multi-chip image sensor module having the advanced test effect before being assembled.

Another object of the present invention is to provide a multi-chip image sensor module having a reduced and miniaturized package volume.

To achieve the above-mentioned objects, the invention provides a multi-chip image sensor module, which includes a first substrate, a photosensitive chip, a lens holder, a lens barrel, an aspheric lens, a transparent layer, a second substrate and a lower chip. The first substrate has an upper surface formed with a plurality of first connecting ends, and a lower surface formed with a plurality of second connecting ends. The photosensitive chip is arranged on the upper surface of the first substrate, and electrically connected to the first connecting ends by a plurality of first wires. The lens holder is formed with a through hole at a center thereof. An internal thread is formed on an inner wall of the through hole, and the lens holder is mounted on the upper surface of the first substrate to encapsulate the photosensitive chip. The lens barrel is arranged within the through hole of the lens holder and formed with an external thread, which is screwed to the internal thread of the lens holder. The lens barrel is formed with a chamber and an opening communicating with the chamber. The aspheric lens and the transparent layer are placed within the chamber. The second substrate has a first surface on which a plurality of signal output ends are formed, and a second surface on which a plurality of signal input ends are formed. The first surface of the second substrate is mounted on the lower surface of the first substrate, and then the signal output ends are electrically connected the second connecting ends of the first substrate. The lower chip is located on the second surface of the second substrate and electrically connected to the signal input ends of the second substrate.

DETAILED DESCRIPTION OF THE INVENTION

Figure 1:
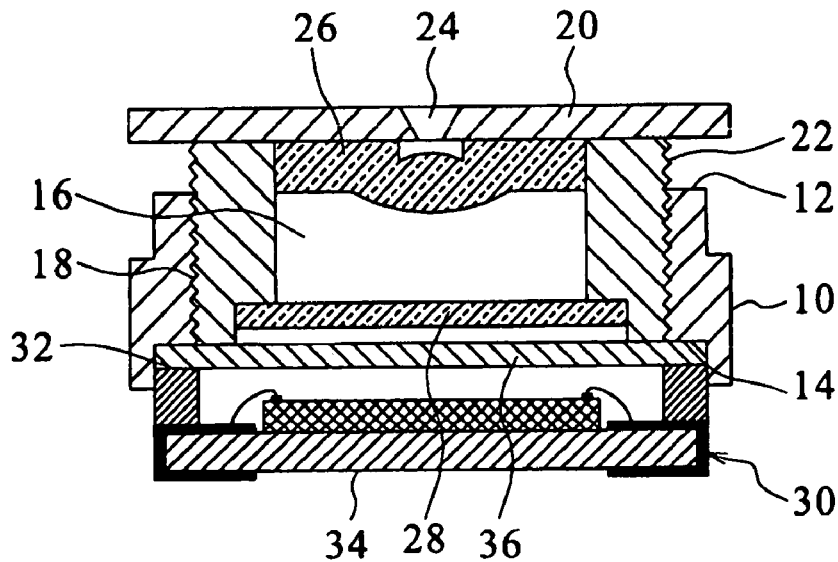
FIG. 1 is a cross-sectional view showing a conventional image sensor module.
Figure 2:
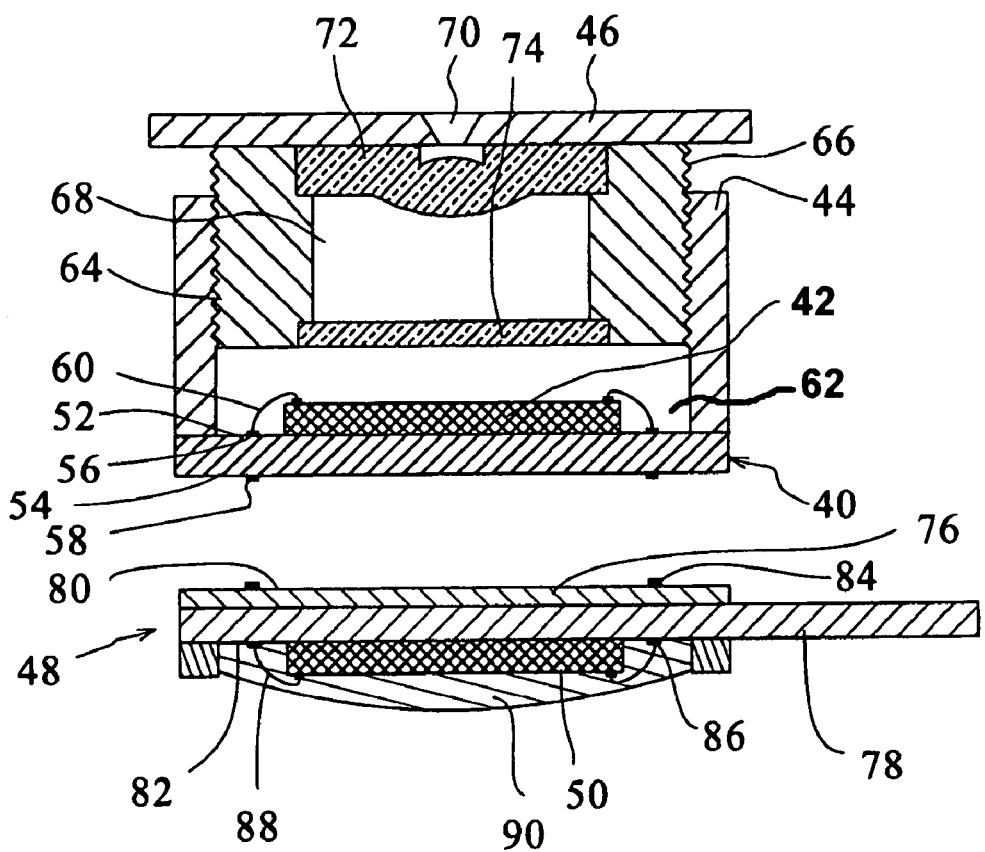
FIG. 2 is an exploded cross-sectional view showing a multi-chip image sensor module of the present invention.
Figure 3:
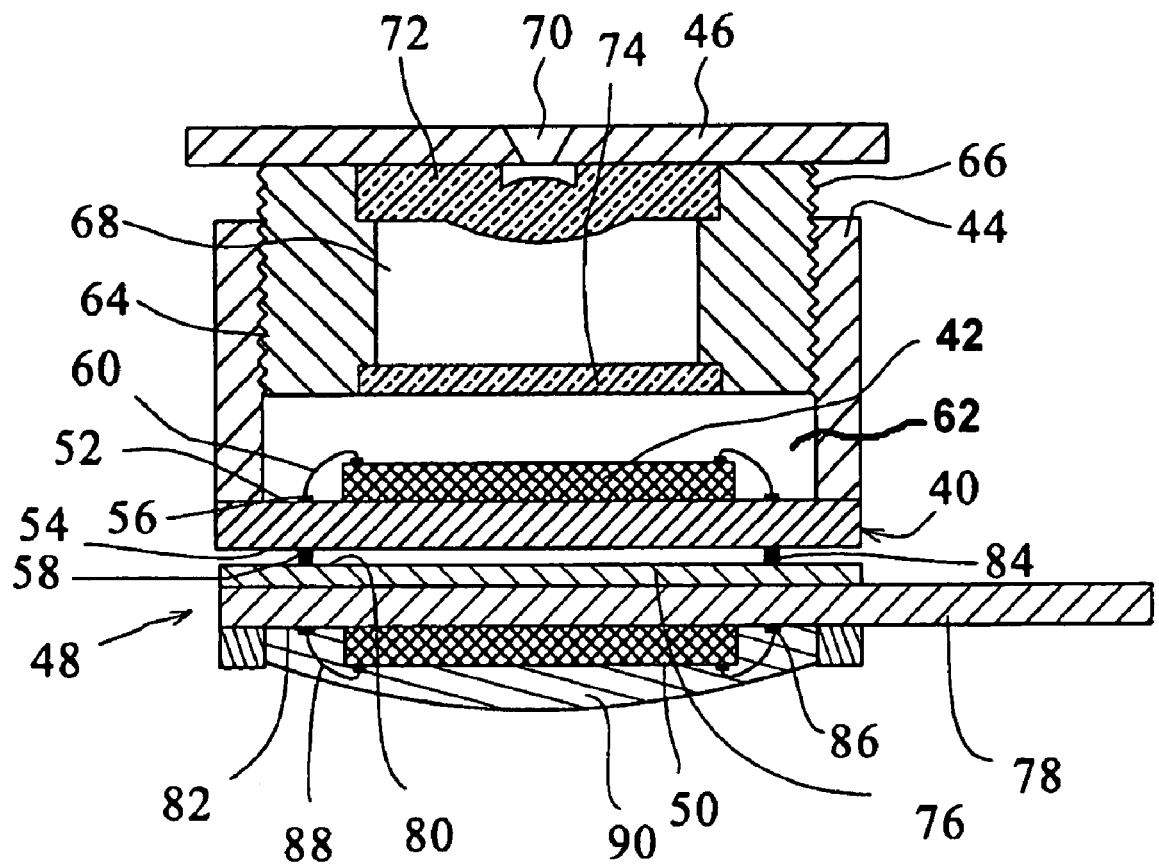
FIG. 3 is a cross-sectional view showing the multi-chip image sensor module of the present invention.

Referring to FIGS. 2 and 3, a multi-chip image sensor module of the present invention includes a first substrate 40, a photosensitive chip 42, a lens holder 44, a lens barrel 46, a second substrate 48 and a chip 50.

The first substrate 40 has an upper surface 52 and a lower surface 54, the upper surface 52 is formed with a plurality of first connecting ends 56, and the lower surface 54 is formed with a plurality of second connecting ends 58.

The photosensitive chip 42 is arranged on the upper surface 52 of the substrate 40, and is electrically connected to the first connecting ends 56 of the substrate 40 by a plurality of wires 60.

The lens holder 44 is formed with a through hole 62 at a center thereof, an internal thread 64 is formed on the inner wall of the through hole 62, and the lens holder 44 is mounted on the upper surface 52 of the first substrate 40 to encapsulate the photosensitive chip 42.

The lens barrel 46 is arranged within the through hole 62 of the lens holder 44 and is formed with an external thread 66, which is screwed to the internal thread 64 of the lens holder 44, and the lens barrel 46 is formed with a chamber 68 and an opening 70 communicating with the chamber 68. An aspheric lens 72 and a transparent layer 74 are placed within the chamber 68.

The second substrate 48 is a flexible/hard combination board, which includes a flexible board 78 and a hard board 76. The second substrate 48 has a first surface 80 on which a plurality of signal output ends 84 are formed, and a second surface 82 on which a plurality of signal input ends 86 are formed. The first surface 80 of the second substrate 48 is mounted on the lower surface 54 of the first substrate 40, and then the signal output ends 84 are electrically connected the second connecting ends 58 of the first substrate 40.

The chip 50 is a signal processor, which is located on the flexible board 78 of the second substrate 48 and is electrically connected to the signal input ends 86 of the second substrate 48 by wires 88. A resin layer 90 for encapsulating the chip 50 is also provided.

The multi-chip image sensor module of the present invention has the following advantages.

1. Since the multi-chip image sensor module of the present invention may test and package the chip and module in the different time periods and then assemble the chip and module, the quality may be enhanced.

2. Since the lens holder is directly arranged on the first substrate 40, it is possible to make the invention have a reduced and miniaturized package volume.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A multi-chip image sensor module, comprising:
   - a first substrate, which has an upper surface and a lower surface, wherein the upper surface is formed with a plurality of first connecting ends, and the lower surface is formed with a plurality of second connecting ends;
   - a photosensitive chip, which is arranged on the upper surface of the first substrate, and electrically connected to the first connecting ends by a plurality of first wires;
   - a lens holder formed with a through hole at a center thereof, wherein an internal thread is formed on an inner wall of the through hole, and the lens holder is mounted on the upper surface of the first substrate to encapsulate the photosensitive chip;
   - a lens barrel arranged within the through hole of the lens holder and formed with an external thread, which is screwed to the internal thread of the lens holder, wherein the lens barrel is formed with a chamber and an opening communicating with the chamber;
   - an aspheric lens and a transparent layer placed within the chamber;
   - a second substrate having a first surface on which a plurality of signal output ends are formed, and a second surface on which a plurality of signal input ends are formed, wherein the first surface of the second substrate is mounted on the lower surface of the first substrate, and then the signal output ends are electrically connected the second connecting ends of the first substrate; and
   - a lower chip located on the second surface of the second substrate and electrically connected to the signal input ends of the second substrate.

2. The multi-chip image sensor module according to claim 1, wherein the second substrate is a flexible/hard combination board, which includes a flexible board and a hard board, the lower chip is mounted on the flexible board, and the hard board is mounted on the lower surface of the first substrate.

3. The multi-chip image sensor module according to claim 1, wherein the lower chip is electrically connected to the signal input ends by second wires.

4. The multi-chip image sensor module according to claim 1, further comprising a resin layer for encapsulating the lower chip.

5. The multi-chip image sensor module according to claim 1, wherein the lower chip is a signal processor and the image sensor module further comprises a resin layer for encapsulating the lower chip.

* * * * *